United States Patent [19]

Ikonen et al.

[11] Patent Number: 5,109,538
[45] Date of Patent: Apr. 28, 1992

[54] CIRCUITRY FOR WIDENING THE EFFECTIVE RANGE OF A TRANSMITTER

[75] Inventors: Raimo Ikonen, Pertteli; Pekka Lonka; Pekka Mikkola, both of Salo, all of Finland

[73] Assignee: Nokia Mobile Phones Ltd., Salo, Finland

[21] Appl. No.: 519,118

[22] Filed: May 2, 1990

[30] Foreign Application Priority Data

May 12, 1989 [FI] Finland .................. 892315

[51] Int. Cl.⁵ .............................. H04B 17/00
[52] U.S. Cl. ........................ 455/89; 455/127
[58] Field of Search .......... 455/115, 117, 127, 128, 455/343, 89; 330/129, 278, 279, 284, 289, 298

[56] References Cited

U.S. PATENT DOCUMENTS 3,697,857 10/1972 El-Banna .................. 455/127
4,870,698 9/1989 Katsuyama et al. ........... 455/127

FOREIGN PATENT DOCUMENTS 0001219 1/1988 Japan .................. 455/127

Primary Examiner—Curtis Kuntz
Attorney, Agent, or Firm—Darby & Darby

[57] ABSTRACT

The present invention concerns a circuitry for widening the power control range of radio telephone. A radio frequency signal is amplified in a controllable power amplifier (1). According to the invention, after the amplifier a controllable switch (4) is connected, which, while in a first state, does not substantially attenuate the RF power emitted transmitted from the power amplifier (1). The first power control range of the transmitter is thus produced. When the switch (4) is in a second state, it directs part of the RF power transmitted from the power amplifier (1) to a resistive element (R1) and permits part of the RF power to be transmitted to the output (RFout) of the transmitter. A second power control range is produced in this manner.

13 Claims, 1 Drawing Sheet

CIRCUITRY FOR WIDENING THE EFFECTIVE RANGE OF A TRANSMITTER

BACKGROUND OF THE INVENTION

The present invention concerns a circuitry by which at least two power control ranges can be established in a transmitter consisting of an amplifier of one or several stages.

In a transmitter of a radio telephone, class-C amplifiers are generally used, which are characterized by good efficiency, 60 to 80 per cent, on high power levels. Because of the great non-linearity of the amplifier, difficulties arise in realizing controlled power control on low power levels, and in addition, when low power levels are used, the efficiency of the amplifier reduces. This causes no harm when a system (or locality of use) is in question in which very low transmission power levels need not be used. The situation will be different, for instance in the digital GSM system covering in future all Europe, in which very low power levels will be in use. If a telephone is going to be used in an aeroplane, it is necessary to use, in order to prevent potential interferece to be caused in the aviational electronics, extremely low power levels.

A typical principle block diagram of a transmitter for a GSM radio telephone is presented in FIG. 1. The block diagram only shows the blocks required for understanding the operation. A signal to be transmitted enters e.g. the input RFin of a three-stage class-C amplifier 1. The gain of the amplifier 1 is controlled by a reference amplifier 3, the output of which is filtered before being input in the power amplifier 1. The input signals of the reference amplifier 3 are the voltage derived from a power detector 2, said voltage being proportional to the output voltage RFout of the power amplifier 1, and the control voltage TXC1 derived from the logic section of the telephone. Said blocks 1, 2 and 3 constitute a control loop which tends to be controlled in a state in which the voltage to be derived from the power detector 2 and the control voltage TXC1 derived from the logic sections of the radio telephone are of equal magnitude.

With the procedure of prior art, such power control range can be obtained which extends e.g. from +13 dBm to +33 dBm. If a wider power control range is wished, the following difficulties arise: the narrowness and non-linearity of the dynamics range and non-linearity of the power detector and the poor controllability of the power amplifier operating in class-C make the widening of the power range difficult.

SUMMARY OF THE INVENTION

The object of the present invention is to provide a procedure by which, when a power amplifier switch known in the art is used, the power control range can be significantly widened.

This is so achieved that a controllable switch has been connected with a power amplifier in series thereafter, said switch, while in a first state, does not substantially attenuate the power (RF power) of the radio frequency emitted from the power amplifier derived in the output of the transmitter, whereby a first power control range of the transmitter is formed, but while in a second state, it controls part of the RF power emitted from the power amplifier to be consumed in a resistive member and permits part of the power be conducted to the output of the transmitter, whereby a second power control range is formed.

According to the invention, when the transmitter is in operation, part of the RF power emitted from the power amplifier may be directed aside and be consumed in a resistive element, e.g. in a resistor, and the rest thereof being directed to the output of the transmitter to be conducted further to the antenna. If the control range of the power amplifier is marked P ... Pmax, this is the control range in the output of the transmitter which is obtained when the power is not conducted aside. If part of the power is conducted aside with a switch, for the new control range in the output of the transmitter is (P ... Pmax)−Pe, in which Pe is the power conducted aside. In this manner two power control ranges formed, which may partly overlap or be delimited to one another.

BRIEF DESCRIPTION OF THE DRAWINGS

The invention is described below more in detail, referring to the annexed figures, in which.

DESCRIPTION OF THE PREFERRED EMBODIMENT

Figure 1:
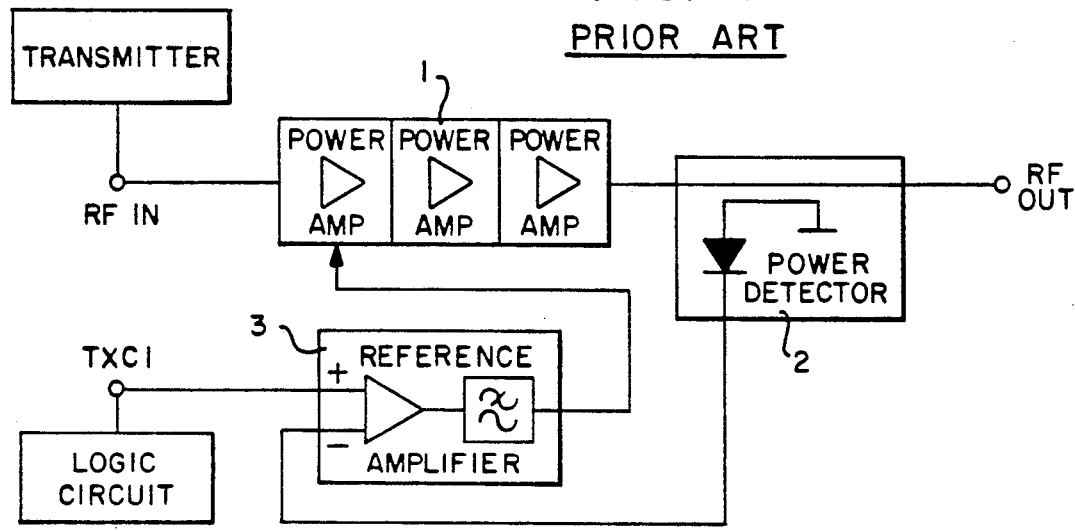
FIG. 1 presents a principal block diagram of a transmitter typical of a GSM radio telephone.
Figure 2:
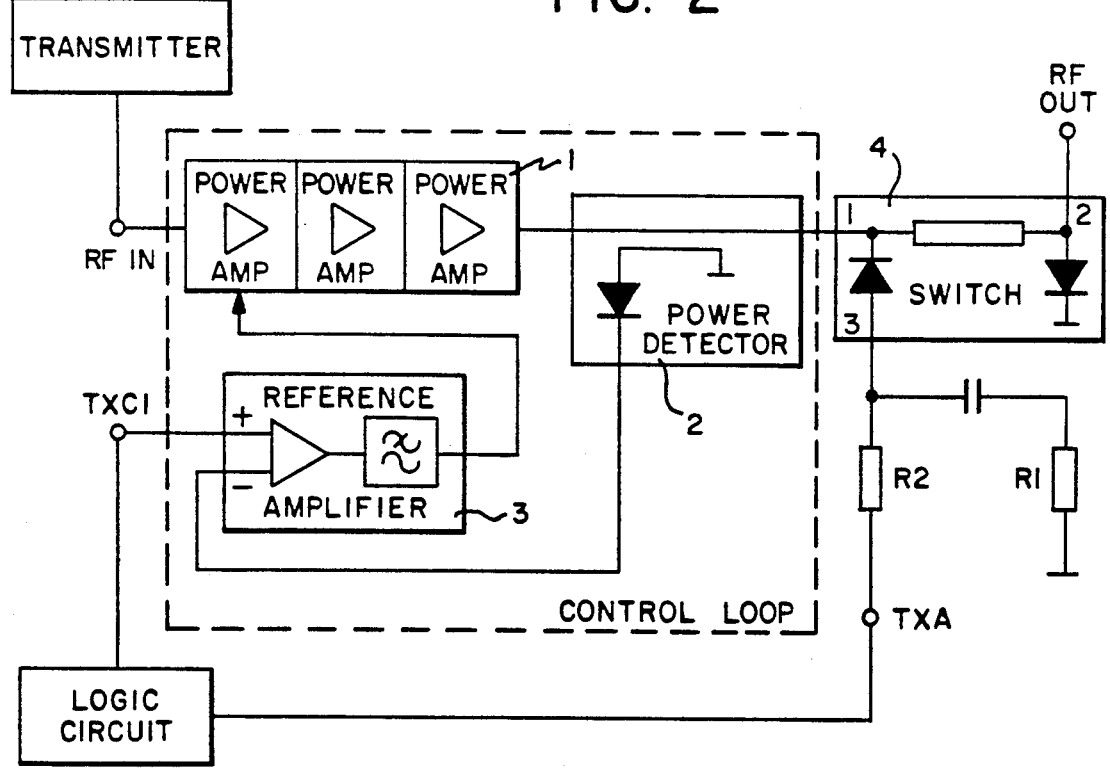
FIG. 2 presents a principle block diagram of the circuitry of the invention.

The operation of the transmitter of the prior art GSM radio telephone is already described above. With said circuitry it is possible to achieve, as was mentioned above, for the power control range in the output RFout of the transmitter the range P ... Pmax. Let us assume that this power control range were in practice +13 dBm to +33 dBm. In the circuitry of the invention presented in FIG. 2, a PIN diode switch 4 is in connection of the invention after the power amplifier 1 and connected in series therewith, said switch being controlled with a control voltage TXA derived from the control logic of the radio telephone and applied to the switch through impedance R2. For the PIN diode switch 4, designs known in the art may be used, such as a switch constructed e.g. from two PIN diodes and from a quarter-wave line. To the gate 3 of the switch is carried control voltage TXA via impedance R2 and to the same gate a ground resistance R1 is connected across a separation capacitor C.

When it is desired that the transmitter should act in a power range of e.g. +13 dBm to +33 dBm, the control voltage TXA derived from the logic is in zero state and no current flows across the diodes of the switch 4. Hereby, the RF power generated by the power amplifier transfers along the transmission line of the switch to the transmitter output RFout. By controlling the power amplifier with control voltage TXC1 derived from the logic the output power may be controlled in said range.

If one wants to use a power control range of a lower level, the control logic of the radio telephone directs the signal TXA to state logical one (e.g. +5 V). Now current flows across the diodes of the PIN diode switch, and the state of the switch changes. The end of the transmission line RFout of the switch towards the connector shortcircuits. Hereby, the transmission line looks open when viewed at the end of the power amplifier 1, and most of the transmitter power is conducted across the PIN diode located at this end to the resistance R1. If the attenuation of the PIN diode switch in this state from gate 1 to gate 2 is e.g. 20 dB, the lower power control range is going to be (+13 dB to +33 dB)−20 dB, or from −7 dB to +13 dB. In this power control range the power is controlled as in the first range, by controlling the power amplifier 1.

The circuitry of the invention has the benefit that it makes the widening of the power range feasible in a simple and inexpensive way. The power detector of the transmitter is not required to have a wide dynamics range, it is enough that it covers the range P to Pmax. Only one analogous control voltage TXC1 is needed in the circuitry. The power control range may be widened further by using a several-stage PIN diode attenuator subsequent to the switch, if the power at said point permits its use. In practice one switch is enough with subscriber telephone power, after which a controllable amplifier may be positioned. Within the protective scope of the claims, the practical implementation of the circuit may greatly differ from what is presented above. The power amplifier may be of a different type from the one described above, and the PIN diode switch may be realized in a number of different ways.

What is claimed is:

1. Circuitry for widening the output power control range of a transmitter of a radio telephone comprising:
   a controllable power amplifier for amplifying an output radio frequency power signal derived from the radio telephone, said power amplifier having at least one stage and being operable over a range of output power;
   a dissipative element for dissipating power;
   controllable switch means connected between the power amplifier and the output of the transmitter of the radio telephone for changing the transmitter output between first and second power control ranges of the transmitter, said switch means including a controllable switch;
   said controllable switch being operable in a first state for passing substantially the RF power emitted from the power amplifier to thereby enable formation of the first power control range, said controllable switch being operable in a second state for directing part of the RF power emitted from the power amplifier so as to be consumed in said dissipative element and for allowing part of the power to be transmitted to the output of the transmitter to thereby cause formation of the second power control range, whereby the power control range of the output of the transmitter is widened beyond that of said first power control range by the formation of the second power control range.

2. Circuitry according to claim 1, wherein the switch is a PIN diode switch.

3. Circuitry according to claim 2, wherein the switch comprises two PIN diodes and a quarter-wave transmission line.

4. Circuitry according to claim 1, further comprising means for enabling the state of the switch to be controlled by a logic circuit of the radio telephone.

5. Circuitry according to claim 1 wherein the controllable switch is a PIN diode attenuator of several stages, whereby a number of power control ranges of the transmitter are produced.

6. Circuitry according to claim 1 wherein the transmitter is part of a digital radio telephone.

7. Circuitry according to claim 1, wherein said second power control range includes power levels which are lower in magnitude than power levels within said first power control range.

8. Circuitry according to claim 7, wherein said first and second power control ranges contain some power levels which overlap with each other.

9. Circuitry according to claim 1, wherein said second power control range is said first power control range less said part of the emitted RF power which becomes consumed by said power dissipative element.

10. Circuitry for widening the output power control range of a transmitter of a radio telephone, comprising:
    a control loop means including in series connection a controllable gain power amplifier operable on a range of power levels, a power detector and a reference amplifier, said power amplifier emitting RF power derived from a circuit of the transmitter, said reference amplifier controlling the gain of said power amplifier by providing a filtered output thereof which is received by said power amplifier, said reference amplifier receiving a first input signal derived from said power detector and related to the output of said power amplifier, and a second input signal in the form of a control voltage level from logic sections of the radio telephone which indicate a desired output power level, said control loop means tending to be controllable such that voltage levels of the first and second input signals are of equal magnitude; and
    controllable switch means connected in series with said control loop means for forming first and second power control ranges, said controllable switch means including a power dissipative element and a switch operable in a first state for passing a major portion of the emitted RF power so as to relate the first power control range to the power range of said power amplifier, said controllable switch being operable in a second state for directing a part of the RF power to become consumed in said power dissipative element and for allowing a remainder of the emitted RF power to pass to an output of the transmitter so as to cause formation of the second power control range, whereby the power control range of the output of the transmitter is widened beyond that of the first power control range by formation of the second power control range.

11. Circuitry according to claim 10, wherein said second power control range includes power levels which are lower in magnitude than at least some of the power levels within said first power control range.

12. Circuitry according to claim 10, wherein said first and second power control ranges contain some power levels which overlap with each other.

13. Circuitry according to claim 10, wherein said second power control range is said first power control range less said part of the emitted RF power which becomes consumed by said power dissipative element.

* * * * *